(12) United States Patent
Bains (10) Patent No.: US 7,617,356 B2
(45) Date of Patent: Nov. 10, 2009

(54) REFRESH PORT FOR A DYNAMIC MEMORY

(75) Inventor: Kuljit S. Bains, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 421 days.

(21) Appl. No.: 10/334,374

(22) Filed: Dec. 31, 2002

(65) Prior Publication Data

US 2004/0128433 A1 Jul. 1, 2004

(51) Int. Cl.
*G06F 12/16* (2006.01)

(52) U.S. Cl. .......................... 711/106; 711/5; 711/154; 365/222

(58) Field of Classification Search ................. 711/105, 711/106, 5; 365/185.25, 222
See application file for complete search history.

(56) References Cited

U.S. PATENT DOCUMENTS

| | | | |
|---|---|---|---|
| 5,835,401 A | 11/1998 | Green et al. | |
| 5,835,937 A | 11/1998 | Miyoshi | |
| 5,896,499 A | 4/1999 | McKelvey | |
| 5,940,851 A | 8/1999 | Leung | |
| 5,959,925 A | 9/1999 | Tatsumi | |
| 6,005,818 A | 12/1999 | Ferrant | |
| 6,028,805 A | 2/2000 | Higuchi | |
| 6,058,451 A * | 5/2000 | Bermingham et al. | 711/106 |
| 6,154,409 A | 11/2000 | Huang et al. | |
| 6,282,606 B1 | 8/2001 | Holland | |
| 6,285,578 B1 | 9/2001 | Huang | |
| 6,331,961 B1 * | 12/2001 | Kengeri et al. | 365/222 |
| 6,377,499 B1 * | 4/2002 | Tobita | 365/222 |
| 6,381,188 B1 | 4/2002 | Choi et al. | |
| 6,430,073 B1 | 8/2002 | Batson et al. | |
| 6,438,016 B1 * | 8/2002 | Keeth et al. | 365/63 |
| 6,449,205 B1 | 9/2002 | Chou | |
| 6,452,834 B1 * | 9/2002 | Kengeri | 365/174 |
| 6,463,001 B1 | 10/2002 | Williams | |
| 6,621,752 B2 * | 9/2003 | Jain | 365/222 |
| 6,711,048 B2 * | 3/2004 | Chien | 365/145 |

(Continued)

FOREIGN PATENT DOCUMENTS

WO  PCT/US 03/39160  2/2004

OTHER PUBLICATIONS

Omid Rahmat, Thomas Pabst, "AMD's Opteron Comes Down Hard", p. 6. Retrieved from http://www.tomshardware.com/2002/04/24/amd/page6.html on Feb. 16, 2007.*
Omid Rahmat, Thomas Pabst, "AMD's Opteron Comes Down Hard", p. 6. Retrieved from http://www.tomshardware.com/2002/04/24/amd/page6.html on Apr. 4, 2008.*

(Continued)

*Primary Examiner*—Christian P Chace
*Assistant Examiner*—Jared I Rutz
(74) *Attorney, Agent, or Firm*—Blakely, Sokoloff, Taylor & Zafman LLP (57) ABSTRACT

A refresh port for a dynamic memory. In one embodiment, an apparatus includes a memory and a refresh command interface to receive a refresh command including a portion indicating signal. Refresh logic performs a refresh to a portion of the memory array specified, at least partially, by the portion specifying signal. Data transfer interfaces receive data transfer commands and transfer memory to and from the apparatus. Another apparatus includes refresh control logic to output a refresh signal and a portion specifying signal via a refresh command interface.

29 Claims, 5 Drawing Sheets

U.S. PATENT DOCUMENTS

| | | | |
|---|---|---|---|
| 6,871,261 B1 * | 3/2005 | Proebsting | 711/106 |
| 2001/0043499 A1 | 11/2001 | Komura et al. | |
| 2002/0069325 A1 | 6/2002 | Pong et al. | |
| 2002/0167835 A1 * | 11/2002 | Jain | 365/154 |
| 2003/0063515 A1 * | 4/2003 | Jain | 365/230.05 |
| 2004/0057315 A1 * | 3/2004 | Jain | 365/222 |

OTHER PUBLICATIONS

TN-04-30 Various Methods of DRAM Refresh, Technical Note, Micron Technology, Inc. (1999) 4 pages.

StarRam, *Synchronous DRAM*, Part No. 2MX32Y3VTW, (Undated) 2 pages.

* cited by examiner

REFRESH PORT FOR A DYNAMIC MEMORY

BACKGROUND

1. Field

The present disclosure pertains to the field of memories, memory controllers, devices having memory controllers, and memory systems.

2. Description of Related Art

Single transistor memories such as dynamic random access memories (DRAMs) are traditionally used because it is hard to beat the density that can be provided with a single cell memory. A capacitor stores a charge (or the lack thereof) to indicate memory state(s). However, a well known downside to this type of memory device is that the capacitive devices that store the state information lose their charge over time. As such, if the charge on the capacitive portion of the memory is not periodically refreshed, information may be lost.

A refresh cycle involves reading a portion of the dynamic memory, such as a row, and then writing the data back into the portion of memory. This is done periodically and frequently enough to avert any data loss due to decay of the charge in the capacitive structure. Since the data from the portion of the memory being refreshed must be read out, it is typically not possible, at least in a single ported memory, to access some portions of the dynamic memory during the refresh cycle. In other words, the refresh cycle typically blocks accesses to at least some regions of the memory device. Accordingly, intelligent memory controllers often control refresh cycles so that they can be scheduled so as to not interfere with more time-critical system memory accesses.

Current memory controllers generally use the same interface or portions of the same interface to send refresh commands or refresh row identifying information as are used to send memory access commands. Additionally, some memories provide a self-refresh function, whereby the memory itself refreshes dynamic cells. Typically, self-refresh is used to retain data during low power periods when the memory controller is disabled and/or does not access the memory device. However, self-refresh does not allow the memory controller to maintain control over which portions of the memory are being refreshed at a particular time.

Some memory devices also perform hidden refresh. A hidden refresh is a refresh performed by the memory device without being signaled by the memory controller to perform a refresh. Such hidden refreshes can impact timing because the memory device is not aware of the accesses that will be requested by the memory controller, making a conflict between the memory controller and the refresh possible. Thus, delays in satisfying memory requests due to refreshes may be encountered in some cases.

BRIEF DESCRIPTION OF THE FIGURES

The present invention is illustrated by way of example and not limitation in the Figures of the accompanying drawings.

DETAILED DESCRIPTION

The following description describes embodiments of a refresh port for a dynamic memory. In the following description, numerous specific details such as memory types, memory latencies, and signal and clock names are set forth in order to provide a more thorough understanding of the present invention. It will be appreciated, however, by one skilled in the art that the invention may be practiced without such specific details. Additionally, some well known structures, circuits, and the like have not been shown in detail to avoid unnecessarily obscuring the present invention.

In various embodiments, a variety of refresh ports are disclosed. A memory controller or device containing a memory controller may utilize a refresh port to output refresh commands to a dynamic memory. Correspondingly, a memory may utilize a refresh port as an input to receive such commands. The use of a refresh port may advantageously offload such refresh requests from the data transfer interface.

Figure 1:
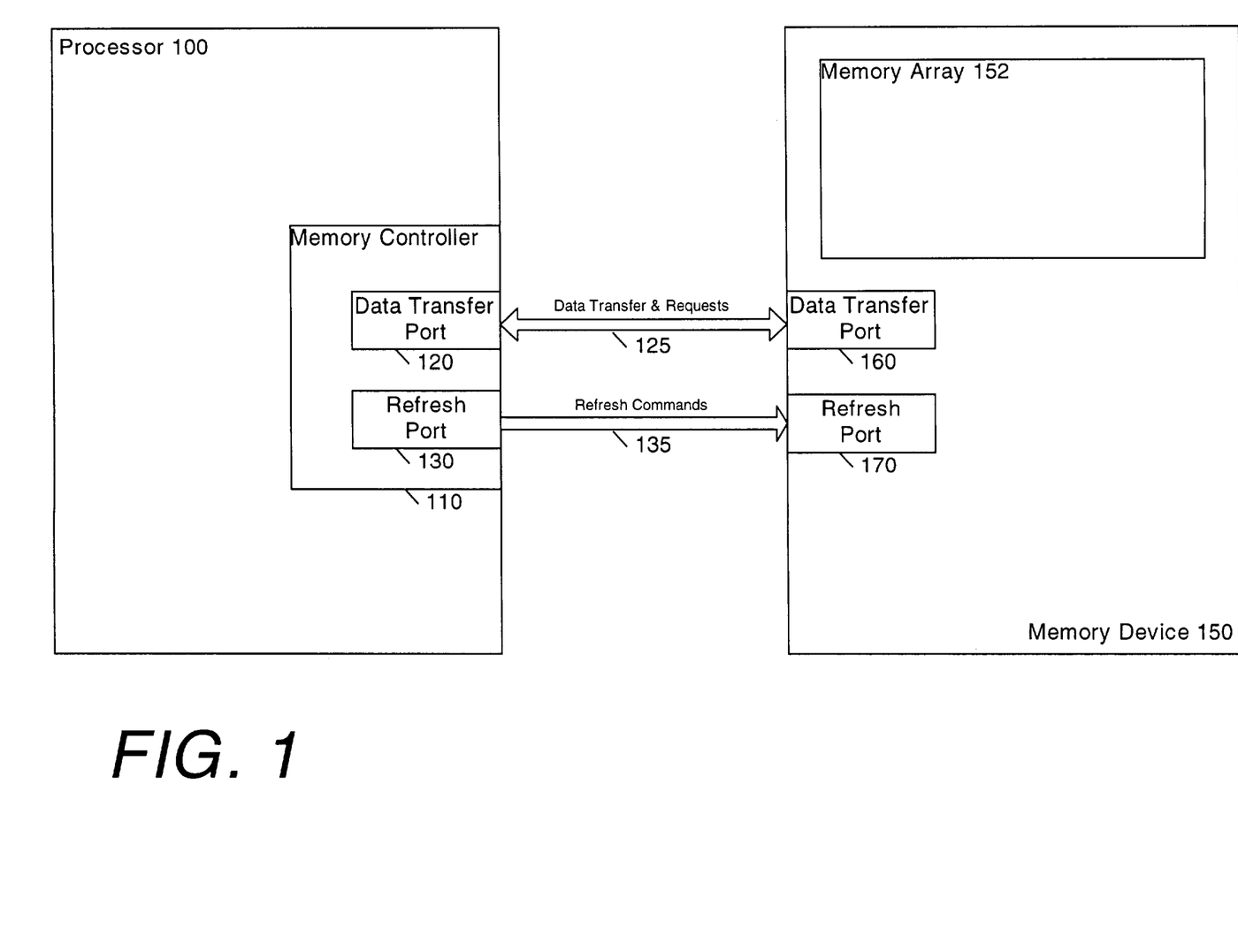
FIG. 1 illustrates one embodiment of a system including a processor and a memory device that each include a refresh port.

FIG. 1 illustrates one embodiment of a system that utilizes dynamic memory refresh ports. In the embodiment of FIG. 1, a processor 100 includes a memory controller 110 that communicates with a memory device 150 having a memory array 152. The processor may be a general purpose processor or a special purpose processor such as a graphics processor, a network processor, or another type of known or otherwise available processor. In other embodiments, the memory controller may be a portion of a different or separate device, such as a chipset, or bridge component. The memory device 150 may be any type of memory that requires or benefits from refreshing. For example, most DRAMs utilize refreshing.

The memory controller 110 includes a data transfer port 120 and a refresh port 130. The data transfer port is coupled to one or more conductors 125 (e.g., electrical or optical conductors). The conductors 125 are coupled to a data transfer port 160 on the memory device 150. The memory controller also includes a refresh port 130. The refresh port is coupled to one or more conductors 135, and these conductors are coupled to a refresh port 170 of the memory device 150. In general, the data transfer ports handle commands, address, and data that form the traditional exchange of memory requests and corresponding data. The data transfer port may include row and column address signal interfaces, among others.

As used in this disclosure, the term port may be used to describe an input or an output interface. The interface may include one or more signal interfaces. For example, an interface may be a pin or a ball or some other interconnect to connect a device such as an integrated circuit to a signal conductor. In some embodiments, a port may be a dedicated port. As discussed herein, a refresh port is a port that, in normal operation, is used to send or receive refresh commands, and is not used to communicate the traditional memory access requests that transfer the bulk of data to or from a particular device. A refresh port may be a dedicated refresh port if it is substantially dedicated to performing refresh related functions.

In contrast, a data transfer port is an interface that is used to communicate the traditional memory access requests that transfer the bulk of data to or from a memory device. A variety of different types and sizes of memory requests may be handled via the data transfer interface. The data transfer interface may include address signal interfaces, data signal interfaces, command signal interfaces, etc. These interfaces may be individual and dedicated or may be multiplexed. Address and commands may be multiplexed in some embodiments, and address, data, and command may all be multiplexed in other embodiments. One of skill in the art will recognize that any of the many different types of known or otherwise available interfaces to communicate memory access requests may be used as a data transfer interface.

In one embodiment, the refresh port handles refresh requests (commands) separately from the data transfer port(s) so as to avoid consuming bandwidth of the data transfer ports. As dynamic memory density continues to increase, the overhead of refreshing memory typically grows. That is because a larger memory typically has more rows, and each row is typically individually refreshed, thereby increasing the number of refreshes needed. As the refresh overhead grows, so too would the amount of overhead required to control such refreshes on the data transfer interface grow using the traditional technique of sending refresh commands over the data transfer interface. Therefore, some embodiments of a refresh port may becomes increasingly valuable as memory densities increase.

For example, if a 256 megabit DRAM has eight banks of memory and 16 k rows, then 16,384 refreshes are required within the refresh period for that part. If the refresh interval is ten nanoseconds and the refresh period is eight milliseconds, then the overhead could grow to as much as sixteen percent. The high overhead problem may just be exacerbated as DRAM densities increase.

In one embodiment, the refresh port includes an interface for a portion specifying signal and an interface for a refresh signal. In other embodiments, such information may be conveyed via a single interface or via shared interfaces. The portion specifying signal at least partially identifies a portion of the memory to be refreshed when the refresh signal is asserted. For example, the portion specifying signal may indicate a row to be refreshed. Since many dynamic memories may have logic such as counters to assist in the refresh process, information from the memory device may be combined with the portion specifying signal to determine more specifically which portion of the memory should be refreshed. Another example is that in a multi-bank memory, the portion specifying signal may specify a bank number, and a counter internal to the memory may specify the row within that bank to be refreshed.

Figure 2:
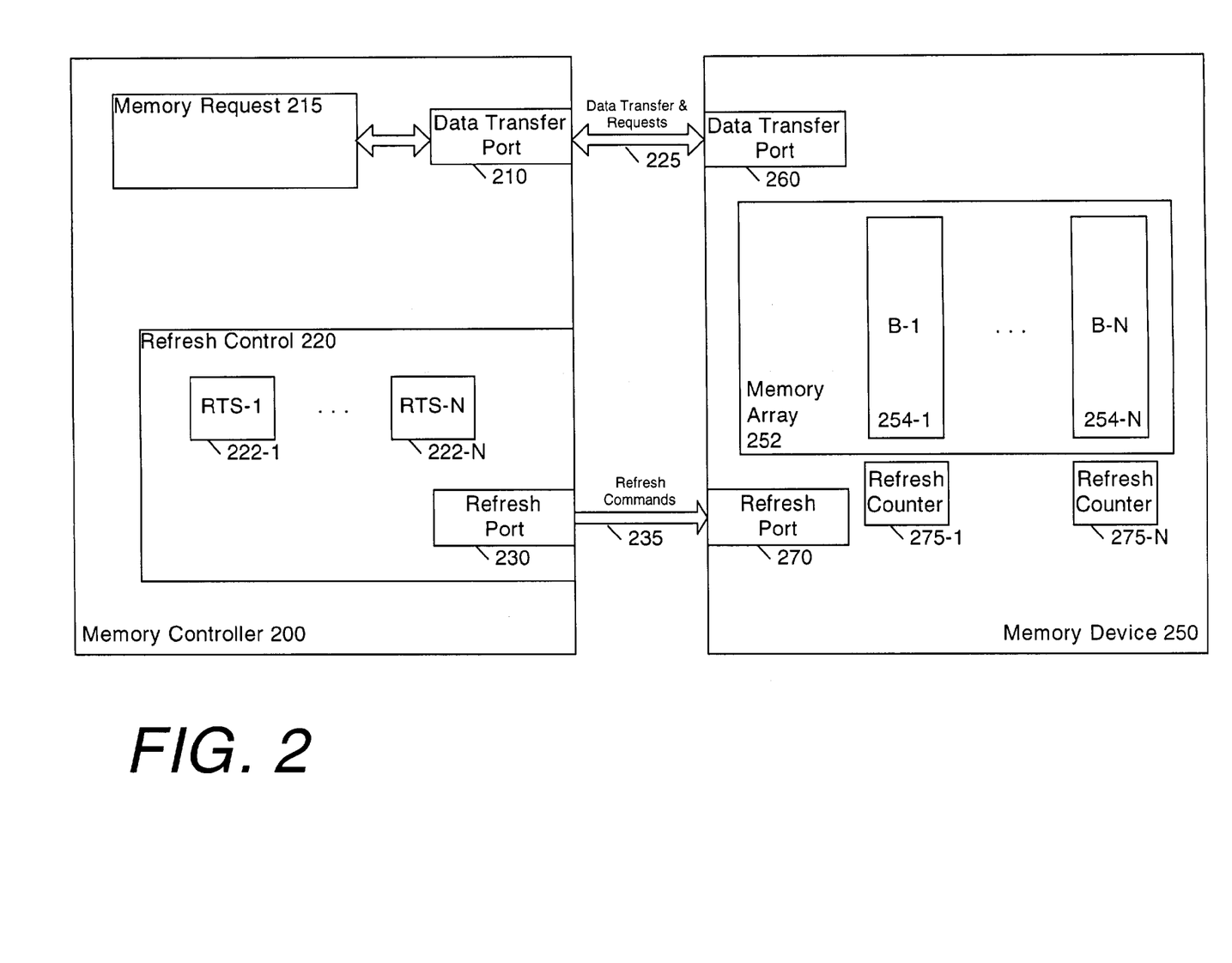
FIG. 2 illustrates one embodiment of a memory controller that interacts with a memory device having a refresh port.

For example, in the embodiment of FIG. 2, a memory controller 200 communicates with a memory device 250 which includes a memory array 252 having N banks, banks 254-1 through 254-N. Typically, N is a number that is an integral power of two, but this is not a requirement. The memory controller includes a refresh port 230 which provides refresh commands generated by refresh control logic 220. The refresh commands are communicated via one or more conductors 235 to a refresh port 270 of the memory device 250. Additionally, a set of refresh counters 275-1 through 275-N are provided in this embodiment, corresponding to banks 254-1 through 254-N.

The refresh command from the refresh control logic 220 may include a bank number and a refresh signal. In some cases a dedicated refresh interface and a dedicated set of bank number indicating interfaces may be provided, with corresponding conductors coupling the refresh signal and bank number to the memory device. The bank number indicates to the memory device which bank to refresh, and the memory device refreshes that bank in response to the refresh signal. In other embodiments, different signaling conventions may be used, as will be appreciated by one of skill in the art. For example, the transmission of a portion indicating signal, such as a bank number, could itself serve as the trigger to refresh that portion.

In another alternative embodiment, bank indicating interfaces may be shared with the traditional data transfer interface. Bank numbers for refreshes may be provided between bank numbers for data access requests. A refresh signal may be separately provided. Thus, some of the benefit of having a dedicated port may still be achieved by having a port and sharing a portion of the other interface(s).

In one embodiment, the refresh signal (or equivalent trigger) causes a refresh to a particular bank and then adjusts the respective refresh counter for the bank. For example, the refresh counter may be incremented or decremented. Thus, as refreshes proceed to a particular bank, the entire bank is eventually refreshed. Moreover, less information needs to be transferred from the memory controller 200 to the memory device 250 because the refresh count is locally stored. Other patterns of refreshing rows may also be used if such other access patterns would provide an advantage with a particular type of memory or in a particular configuration.

In one embodiment, the memory controller 200 and the memory device exchange memory requests and data via data transfer ports 210 and 260. A set of conductors 225 convey signals reflective of the data and requests between the respective ports 210 and 260. The memory controller 200 may schedule requests according to memory request logic 215. Requests may be received via an additional conductor or conductors linking the memory controller 200 to another device, or may be generated by processing logic on a device that includes the memory controller 200. In this embodiment, since the memory control logic includes both the memory request logic 215 and the refresh control logic 220, the memory controller 200 can intelligently schedule refreshes to reduce interference with memory requests.

For example, the memory controller 200 can avoid scheduling a refresh to bank one at the same time a memory request to bank one is occurring. Thus, different banks can be read (or written to) and refreshed at the same time. Some memories may permit the reading (writing) of multiple banks or refreshing of multiple banks, however, the concept remains the same. The memory controller 200 can attempt to optimize the mix of refreshes and memory requests. The ability to separately transmit the refreshes via a dedicated port that does not consume memory request or data bandwidth may advantageously also further increase the effective bandwidth between the memory and the controller.

In order to provide high memory access bandwidth, the memory controller 200 may generally prefer memory requests to a particular bank when a conflict between refreshing and memory access occurs. Therefore, during times of high memory utilization, the refresh control logic 220 may be somewhat starved for access to the memory array 252. In some cases, the memory device may be a dynamic memory that will lose data if it is not refreshed within a given period of time, and often such a loss would be considered unacceptable. Therefore, the refresh control logic 220 may include one or more refresh timing supervisors. Such refresh timing supervisors track the amount of time taken in refreshing a group of rows of a memory. If too much time is being taken to refresh a group of rows in a memory, then accesses to that group of rows for memory requests from the memory request logic 215 may be inhibited to allow an increased mix of refresh requests to the neglected group of rows.

For example, the embodiment of FIG. 2 includes one refresh timing supervisor per bank, RTS 222-1 through 222-N. The refresh timing supervisors track the time being taken to refresh respective banks 254-1 through 254-N of the memory device 250. In cases where a particular bank is receiving insufficient refreshes, the refresh timing supervisor may communicate to the memory request logic 215 to inhibit accesses to that bank such that more refreshes may be allowed. The memory request logic 215 need not halt all requests to a particular bank, for example, but rather may throttle or somewhat reduce such accesses over time. Different and/or graduated levels of reduction may be employed depending on the severity of the need for refreshes. Additionally, the memory request logic 215 need not necessarily inhibit all accesses, but rather can favor other banks that do not conflict with refreshes to the bank in need of refreshing.

Figure 3:
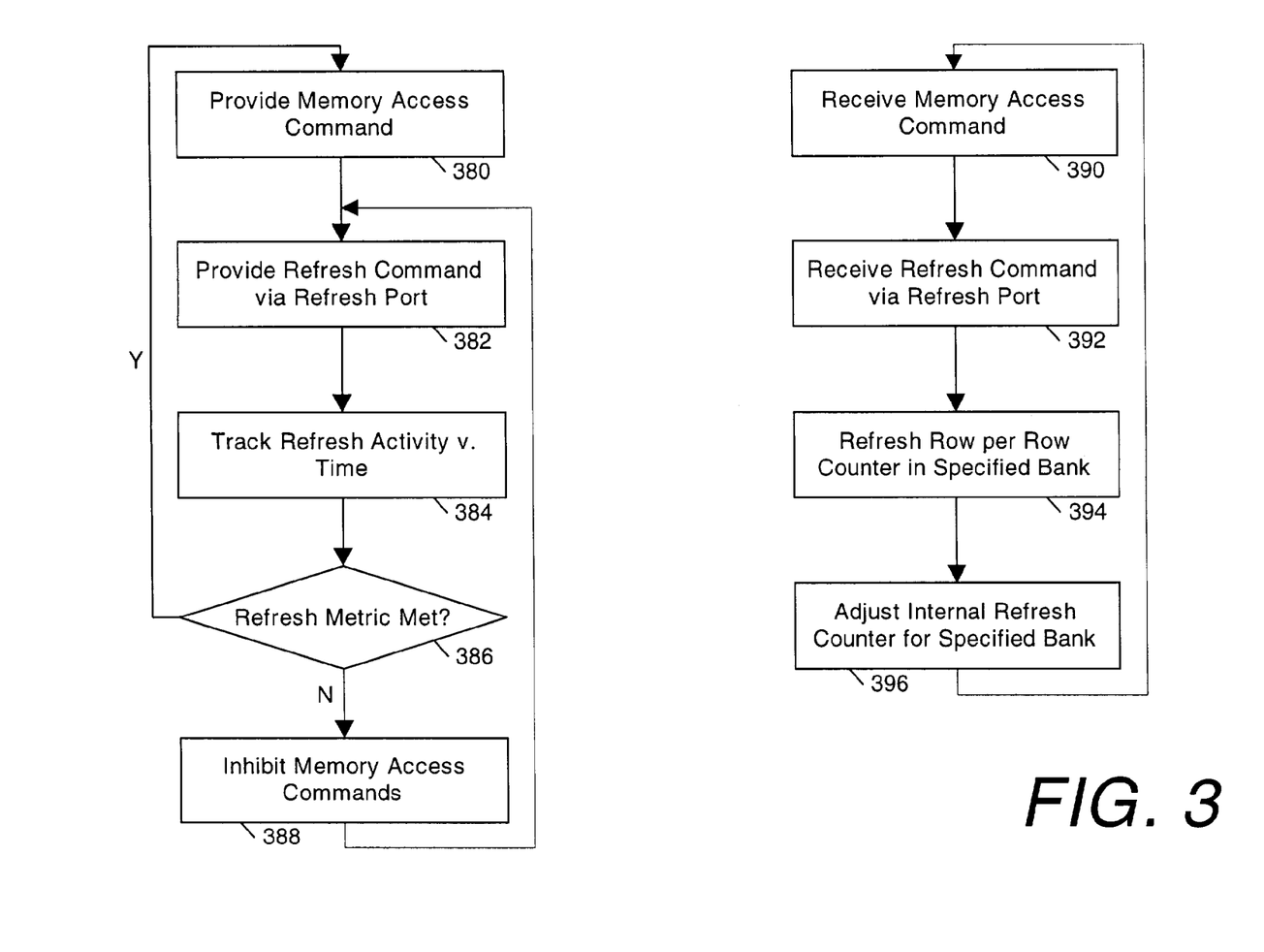
FIG. 3 illustrates a flow diagram for operations of a memory controller and a memory device according to one embodiment.

FIG. 3 illustrates in flow chart form the operations performed by, for example, a memory controller (which may be integrated or discrete) and a memory device according to one embodiment. As indicated in block 380, the memory controller provides a memory access command to the memory device. The memory access command typically requests a read or a write of data to a memory array of the memory device. The memory device receives the memory access command, as indicated in block 390.

Additionally, as indicated in block 382, the memory controller issues a refresh command via its refresh port. In some embodiments, the refresh command may be issued simultaneously (e.g., in the same clock cycle) to the memory access command, but in other embodiments these commands may or may not be correlated some or all of the time. The memory device receives the refresh command via its refresh port as indicated in block 392.

In response to receiving the refresh command, the memory device performs a refresh operation as indicated in block 394. In some embodiments, the refresh operation may be to a row that is partially specified by a refresh counter in the memory and partially specified by a bank number transmitted as a part of the refresh command, as discussed with respect to FIG. 2. In other embodiments, the portion to be refreshed may be specified in other manners. Some or all of the portion being refreshed may be specified by the memory controller, but the method of specifying a portion can vary based on the organization and/or architecture of the memory device.

If the memory device is a memory device having a refresh counter, then the memory device may adjust its refresh counter as indicated in block 396. In embodiments such as the embodiment of FIG. 2, each bank may have a refresh counter, and therefore, the memory device may adjust (e.g., increment or decrement) a refresh counter for a particular bank.

On the memory controller side, the events in blocks 384 through 388 are not necessarily correlated in time to events in the memory device. After the refresh command is sent, however, the memory controller updates its internal counters, timers, etc., to track the refresh activity. In particular, the memory controller tracks whether a refresh metric has been achieved. The metric typically indicates whether enough refreshes are occurring over time, signaling whether or not it would be prudent to increase the mix of refreshes to avoid data loss. If the metric has been achieved, then activity may continue as usual, with the memory controller returning to block 380. If, however, the metric has not been reached, then memory access commands may be inhibited as indicated in block 388.

For example, as shown in the embodiment of FIG. 3, refresh activity may be performed before another memory access request is provided. However, memory controllers may have quite sophisticated scheduling capabilities, and it may be possible to provide a bias toward refreshes or to otherwise favor refreshes (or favor memory requests less). In any case, some inhibiting may be performed to favor refreshes. The inhibiting may be progressive, providing a stronger bias toward refreshes as the need to refresh become more dire. The inhibiting may also be only for a particular bank of memory or other group of memory rows, allowing other rows to be readily accessed.

Figure 4:
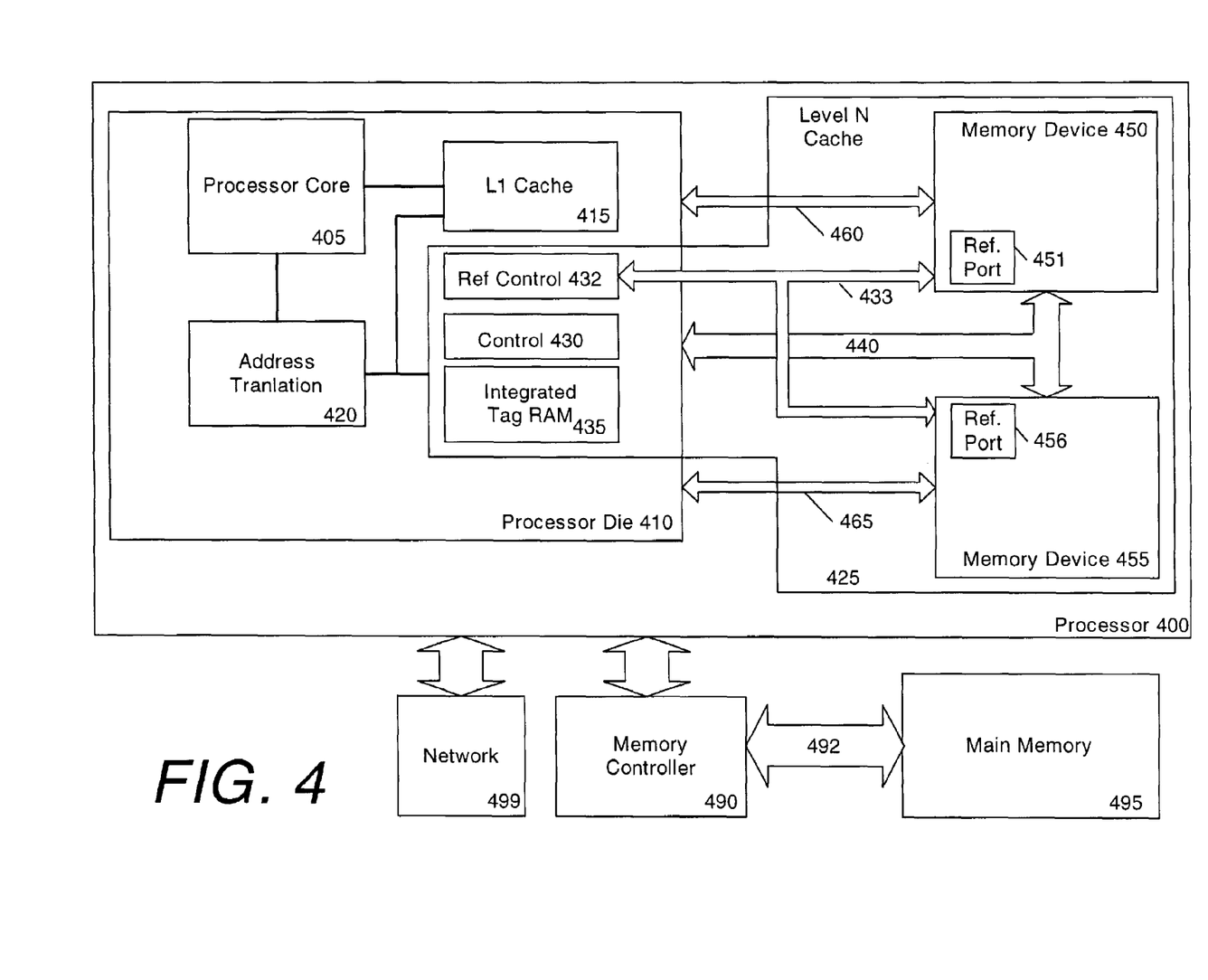
FIG. 4 illustrates one embodiment of a DRAM cache that utilizes a refresh port.

FIG. 4 illustrates one embodiment of a system including a processor 400 utilizing a DRAM cache that has refresh ports. The processor 400 may be any of a wide variety of types of processors. For example, the processor 400 may be a general purpose processor usable for a variety of applications including computers such as desktop, laptop, server, embedded, etc., computers. The processor 400 may also be a special purpose processor such as a network processor, a communications processor, a graphics processor, a digital signal processor, or any other type of special purpose processor that may benefit from cache memory.

In the embodiment of FIG. 4, the processor 400 includes a processor die 410 as well as memory devices 450 and 455, and buses to connect to these memory devices to the processor die 410. In the embodiment of FIG. 4, a data bus 460 and a command and address bus 440 couple the memory device 450 to the processor die 410. Similarly, a data bus 465 and the command and address bus 440 couple the memory device 455 to the processor die 410. Additionally, the processor die 410 includes a cache control circuit 430, an integrated tag RAM 435, and refresh control logic 432. Together, the cache control circuit 430, the integrated tag RAM 435, the refresh control logic 432, the two memory devices 450 and 455, and the interconnecting buses form a level-N cache memory 425. In other embodiments, more or fewer memory devices may be used. Additionally, separate memory devices may have their own address and command buses, and these buses may or may not be multiplexed in various embodiments.

In the embodiment of FIG. 4, each of the two memory devices 450 and 455 includes a refresh port, respectively refresh port 451 and 456. In some cases, the two (or more) memory devices may be addressed similarly (i.e., the same banks, rows, etc. being opened in each, and each providing a portion of data back). Therefore, multiple refresh ports such as refresh ports 451 and 456 may be coupled by conductors 433 to the refresh control logic 432, and controlled similarly. In other words, the same rows may be refreshed in each memory device under control of the refresh controller by routing the same signals to the various devices. In other embodiments, the various memory devices may have individual and distinct refresh commands.

In the embodiment of FIG. 4, the processor die 410 also includes a level one cache 415, a core 405, and address translation logic 420. The core 405 represents any execution core that is capable of executing instructions, including instructions that generate accesses to memory. In response to an instruction that generates an access to memory, the core 405 outputs a memory request including an address to the address translation logic 420. The address translation logic 420 may perform conventional paging, segmentation, and/or other known or otherwise available address translation functions. Additionally, the request is communicated to the level one cache 415. The level one cache 415 may work on translated or untranslated addresses in different embodiments. In some embodiments, testing whether a cache hit occurs in the level one cache 415 may be a precondition to forwarding the memory request to the next level of cache. In other embodiments, accesses to multiple levels of cache may be initiated prior to hit or miss determinations in the lower-level caches.

In either case, the memory request is forwarded to the level-N cache 425 at some point if a miss in the lower level cache occurs. The memory request may be forwarded to the level-N cache and then aborted in some embodiments upon a lower level cache hit. Assuming that a cache lookup is to be performed in the level-N cache 425, the cache control circuit 430 receives the translated address from the address translation logic 420 and initiates transmission of that address to the memory devices. If the command and address bus 440 is immediately available, a portion of the address from the request may be driven on the command and address bus 440. However, the cache control circuit 430 may be forced to queue the request if the command and address bus 440 is in use. In either case, the cache control circuit 430 initiates a transfer of a first portion of the translated address by dispatching the first portion of the translated address received from the address translation logic 420 (either to the bus or to a queue). In this embodiment, at the point when the transfer of the first address portion is initiated, the remainder of the address is unknown because the tag lookup has not been completed. In fact, it may not yet be known whether the requested memory location is cached in the cache 425 because the tag lookup typically also indicates whether a hit or miss occurred.

The cache control circuit 430 also initiates the tag lookup according to the address received from the address translation logic 420. Thus, the way information from the integrated tag RAM 435 is not available until subsequent to at least initiating the transfer of the first address portion to the memory device in this embodiment. The way information is driven on a subsequent cycle on the command and address bus 440. Thus, the tag lookup latency may be advantageously masked by first transmitting the row information and then transmitting the column information which indicates the results of the tag lookup.

The bus 440 in the embodiment of FIG. 4 may be a multiplexed bus in that multiple cycles may be used to transmit a full address as needed to uniquely request a particular size entry from the memory array. For example, a row address portion and a command may first be transmitted over the bus, and then a column address may be transmitted over at least some of the same bits of the bus in order to select a cache line or other unit of data. More, less, or different multiplexing arrangements may be used; however, the multiplexed address and command bus generally transmits at least some bits of a full address (e.g., row bits) in serial fashion with respect to other bits of the full address (e.g., column bits). In some embodiments, commands have separate commands lines and commands may or not be multiplexed. In some embodiments, commands may be multiplexed with the address or address portions. Also, as previously mentioned, some embodiments may not use a multiplexed bus at all.

The system shown in FIG. 4 includes a memory controller 490 coupling the processor 400 to a main memory 495 via a memory bus 492. The main memory may store memory locations that are also held in the various level of caches as well as memory locations that have not yet been cached in any of the various cache levels. Therefore, the main memory 495 is typically accessed in response to a miss in the Level-N cache, which is in this embodiment the highest level of cache closely coupled to and/or included as a part of the processor. The particular type of memory or storage technology used for main memory may vary, and the main memory may also include various levels of hierarchical store (e.g., DRAM memory, disk, etc.). Additionally, the memory controller 490 may also be integrated with the processor in some embodiments.

Finally, the system of FIG. 4 includes network interface logic 499. The network interface logic allows the system and the processor 400 to communicate with other devices via any of a variety of types of networks. For example, the network interface logic 499 may provide an interface to a local area network, a wireless network, a wide area network, etc. The network interface logic 499 may also or instead include communications logic to modulate or encode signals for analog, digital, or optical transmission. The network interface logic 499 may be indirectly coupled to the processor via one or more bridges or other components in some embodiments.

Figure 5:
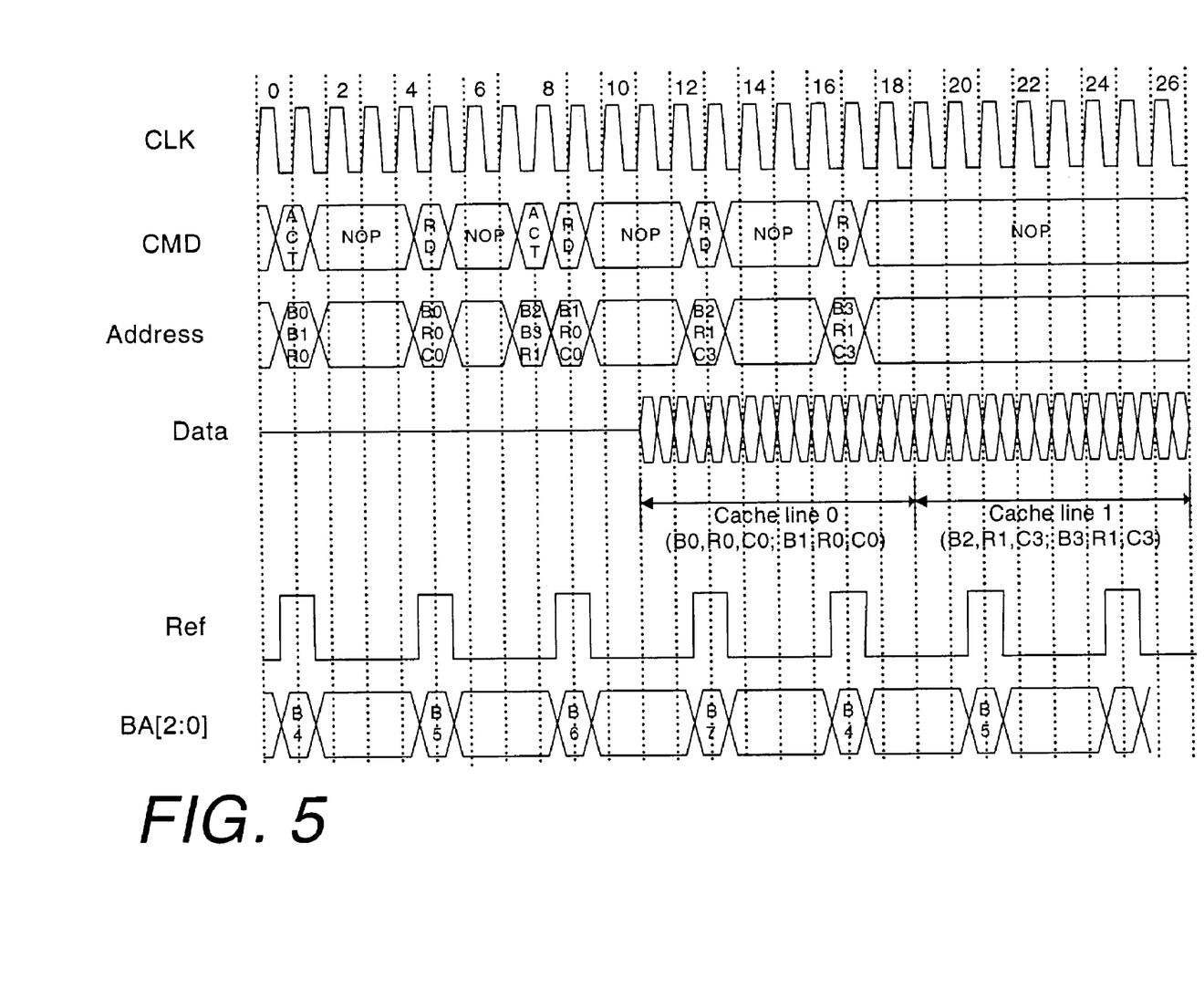
FIG. 5 illustrates a timing diagram for an example set of operations according to one embodiment.

FIG. 5 illustrates one example of a series of transactions between a memory controller and a memory device such as that shown in FIG. 4. In this embodiment, the data transfer interface is shown as having a separate command bus (CMD), address bus, and data bus. For example, the bus 440 in FIG. 4 may include address and command conductors and data buses 460 and 465 may include data conductors. These buses may be multiplexed to varying degrees in other embodiments. A command clock (CLK) provides a reference, although other clocking schemes or asynchronous transmission may be used in other embodiments. Also, in this embodiment, each memory device has eight banks, so three refresh bank address signals (BA[2:0]) are used to encode the bank number.

In the example of FIG. 5, an activate command (ACT) is driven on the command bus in clock cycle zero. The bank and row information is driven on the address bus, and in this case, bank zero, bank one, and row zero are indicated. In this embodiment, a single command opens two pages (i.e., two banks, a row in each) because cache lines are stored in two banks. Simultaneously (i.e., in the same CMDCLK cycle), a refresh signal (in this example active high) is driven on the refresh signal line of the refresh port. Additionally, a refresh bank number, in this case bank four, is driven on the bank lines of the refresh port. Bank four does not interfere with the two banks (banks zero and one) opened in response to the read command.

The activity in clock cycle zero is followed by three no operation (NOP) cycles. In clock cycle four, the read command is driven on the address bus with bank, row and column information (bank zero, row zero, column zero). At this time, a second refresh operation is driven via the refresh port. Thus, another active refresh signal is driven, and the refresh bank number (bank five) is driven via the refresh port. If a refresh were desired to the same bank (i.e., bank four), then a longer delay may be needed because a memory devices is likely to specify a required delay between such accesses.

No operation is driven in clock cycles five and six on the command bus. In clock cycle seven, the activate command is once again given on the command bus, with the address bus indicating bank two, bank three, and row one. In clock cycle eight, the read command is driven on the command bus, and bank one, row zero, and column zero are driven on the address bus. Also in clock eight, another refresh signal is driven, and the refresh bank signals indicate bank six.

No operation is driven in clocks nine through eleven, but data corresponding to the first read request (bank zero, row zero, column zero) begins to return in clock eleven. In the example shown, the data is provided in a double-pumped manner, with two data items being delivered per clock cycle. The data is delivered in clock cycles eleven through fourteen in this example.

During clock cycle twelve, another read command is driven, and signals indicating bank two, row one, column three are driven on the address bus. Additionally, another refresh signal and another refresh bank number (bank seven) is driven via the refresh port. During clock cycles thirteen, fourteen, and fifteen, no commands are driven on the command bus. However, in clock cycle fifteen, data from the second read command (bank one, row zero, column zero) begins to appear on the data bus. Data for the second read command is driven during clock cycles fifteen through eighteen.

During clock cycle sixteen, another read command is driven, and bank three, row one, column three are driven on the address bus. Additionally, another refresh signal and another refresh bank number (bank four) is driven via the refresh port. Bank four is chosen to again avoid interfering with pending read transactions. Thereafter, no further commands on the command bus are shown in this example, but an additional refresh to bank five occurs at clock cycle 20. Furthermore, data from the third read (bank two, row one, column three) and the fourth read (bank three, row one, column three) is placed on the data bus in clock cycles nineteen through twenty six. In one embodiment, cache lines are split across two banks in each memory device. Therefore, data for two cache lines is provided in clock cycles eleven through twenty-six.

It is to be understood that the above commands and timing relationships are given as illustrative only. Many different timing schemes are likely in view of the many different configurations of memory devices both now available and within the reach of one of skill in the art. However, advantages may be achieved across a variety of memories by employing a refresh port.

Moreover, a design may go through various stages, from creation to simulation to fabrication. Data representing a design may represent the design in a number of manners. First, as is useful in simulations, the hardware may be represented using a hardware description language or another functional description language Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In any representation of the design, the data may be stored in any form of a machine readable medium. An optical or electrical wave modulated or otherwise generated to transmit such information, a memory, or a magnetic or optical storage such as a disc may be the machine readable medium. Any of these mediums may "carry" or "indicate" the design or software information. When an electrical carrier wave indicating or carrying the code or design is transmitted, to the extent that copying, buffering, or re-transmission of the electrical signal is performed, a new copy is made. Thus, a communication provider or a network provider may make copies of an article (a carrier wave) embodying techniques of the present invention.

Thus, techniques for a refresh port for a dynamic memory are disclosed. While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art upon studying this disclosure. In an area of technology such as this, where growth is fast and further advancements are not easily foreseen, the disclosed embodiments may be readily modifiable in arrangement and detail as facilitated by enabling technological advancements without departing from the principles of the present disclosure or the scope of the accompanying claims.

What is claimed is:

1. A memory device comprising:
    a dynamic random access memory (DRAM);
    a data transfer port coupled to the DRAM to receive data transfer requests and memory addresses from an external memory controller;
    a refresh port coupled to the DRAM to receive refresh commands from the external memory controller, wherein the external memory controller includes a memory request logic to transmit said data transfer requests and memory addresses to the memory device and refresh control logic to provide said refresh commands and to inhibit memory access commands during a refresh, and wherein the external memory controller schedules refreshes to different memory locations than the data transfer requests, and schedules data transfer requests to different memory locations than the refresh requests to reduce interference with the data transfer requests by coordinating the data transfer requests from the memory request logic with the refresh commands from the refresh control logic by throttling a rate of memory requests to a portion of the DRAM needing additional refreshes.

2. The memory device of claim 1 wherein said refresh port is a dedicated port that is dedicated to performing refresh related functions.

3. The memory device of claim 1 wherein the refresh port comprises:
    a plurality of portion-indicating interfaces;
    a refresh command interface.

4. The memory device of claim 3 wherein the refresh port is an input port further comprising:
    logic to receive a bank indicating signal via the plurality of portion-indicating interfaces;
    logic to receive a refresh command from the refresh command interface.

5. The memory device of claim 3 wherein said plurality of portion-indicating interfaces comprise a plurality of bank number interfaces to specify a row for refreshing by specifying one of a plurality of banks, wherein a row number is automatically generated.

6. A memory device comprising:
    a memory array;
    a refresh command interface to receive refresh commands from a memory controller, the refresh commands each including a portion specifying signal wherein the refresh command interface throttles a rate of memory requests to a portion of the memory array needing additional refreshes;
    refresh logic to refresh a portion of said memory array specified by the portion specifying signals in response to the refresh commands;
    a plurality of data transfer interfaces to receive data transfer commands from the memory controller, and to transfer memory data to and from the memory device, wherein the memory controller prevents scheduling the refresh commands and the data transfer commands to a same location within the memory array to reduce interference with the transfer of memory data without having to provide separate data transfer and refresh bit-lines for each location in the memory array.

7. The memory device of claim 6 wherein said refresh command interface comprises:
    a plurality of portion-specifying interfaces to receive said portion specifying signal that specifies a portion of the memory array to be refreshed;
    a refresh interface to receive a refresh signal.

8. The memory device of claim 7 wherein said memory array comprises a plurality of banks, further comprising:
    a plurality of bank refresh counters, one of the plurality of bank refresh counters being associated with each one of said plurality of banks, wherein said portion specifying signal specifies a bank, and wherein a refresh counter associated with the bank specifies a row within the bank.

9. The memory device of claim 8 wherein in response to the refresh signal, the refresh logic refreshes the row in the bank specified by the portion specifying signal and alters a refresh counter value of the refresh counter associated with the bank.

10. The memory device of claim 9 wherein the refresh logic increments or decrements the refresh counter in response to the refresh signal.

11. The memory device of claim 6 wherein the plurality of data transfer interfaces comprises a plurality of data interfaces and a plurality of address interfaces.

12. An apparatus comprising:
a plurality of data transfer interfaces to output data transfer requests and to transfer memory data to and from the apparatus;
a refresh command interface to output refresh commands to a memory device;
refresh control logic to output a refresh signal and a portion specifying signal via the refresh command interface by throttling a rate of memory requests to a portion of the memory device needing additional refreshes;
a processor portion to execute a plurality of program instructions and to initiate a plurality of memory requests to be communicated via the plurality of data transfer interfaces, wherein the processor portion prevents scheduling the outputting of the refresh commands and the outputting of the data transfer requests to a same memory location in the memory device to reduce interference with the transfer of memory data without having to provide separate data transfer and refresh bit-lines for each location in the memory array; and
a cache control portion, said cache control portion coupled to the processor portion and coupled to the plurality of data transfer interfaces to generate the plurality of memory requests as cache accesses on the plurality of data transfer interfaces.

13. The apparatus of claim 12 wherein said portion specifying signal comprises bank specifying signals.

14. The apparatus of claim 13 further comprising:
refresh count logic, said refresh count logic to track refresh activity and to inhibit activity on said plurality of data transfer interfaces if a refresh metric is not met.

15. The apparatus of claim 13 wherein said apparatus comprises an integrated processor and memory controller.

16. The apparatus of claim 12 wherein said apparatus comprises machine readable data carried on a machine readable medium.

17. The apparatus of claim 12 wherein said apparatus comprises one or more of hardware, software, and firmware.

18. A method comprising:
providing commands from an external memory controller to a separate memory device that requires or benefits from refreshing, the commands including memory request commands and memory address signals that together define memory accesses, via an data transfer interface;
providing from the external memory controller to the separate memory device, refresh commands specifying portions to refresh of a memory array via a refresh port wherein the data transfer port is separate from the refresh port;
scheduling by the external memory controller the refresh commands and the memory request commands to different portions of the memory array to reduce interference with the memory accesses wherein the external memory controller transmits said cache memory requests to a selected portion of the cache memory device and inhibits memory access commands to the selected portion of the cache memory device during a refresh; and
scheduling, by the external memory controller, refreshes to different portions of the cache memory device to reduce interference with cache memory requests by coordinating data transfer requests with said refresh commands by throttling a rate of memory request to the selected portion of the cache memory.

19. The method of claim 18 wherein providing refresh commands further comprises:
asserting a refresh signal;
providing a plurality of portion indicating signals.

20. The method of claim 19 further comprising:
tracking refresh activity;
inhibiting memory requests in response to said tracking if a refresh metric is not met.

21. The method of claim 19 wherein said refresh port is a dedicated refresh port separate from said command interface.

22. The method of claim 21 wherein said plurality of portion indicating signals comprise a plurality of bank indicating signals.

23. The method of claim 22 further comprising:
providing commands defining a memory access and providing a refresh command both being at least partially performed during a clock cycle.

24. A system comprising:
a first device having a memory request interface and a refresh output port;
a memory device comprising a memory array, the memory device being coupled to the first device, the memory array having a refresh input port coupled to the refresh output port, the memory device to refresh memory cells at least partially specified by refresh commands in response to refresh commands received from the first device via the refresh output port and the refresh input port, wherein said first device is a processor comprising a cache controller to communicate with the memory device, wherein the memory device is treated as a cache memory by the cache controller and the first device is to generate a plurality of portion-specifying signals transferred to the memory device via the refresh output port and the refresh input port, further wherein the cache controller transmits the cache memory requests to the cache memory device and inhibits memory access commands during a refresh and throttles a rate of memory request to a portion of the cache memory needing additional refreshes.

25. The system of claim 24 wherein said first device memory controller is to generate a refresh signal that is transferred to the memory device via the refresh output port and the refresh input port.

26. The system of claim 25 wherein said memory device further comprises a plurality of memory banks, wherein each bank has an associated row counter, and wherein said memory devices refreshes a row in a bank indicated by said plurality of bank indicating signals and adjusts the associated row counter in response to the refresh signal.

27. The system of claim 26 wherein said first device memory controller further comprises a refresh timing supervisor comprising a plurality of timers each associated with one of the plurality of memory banks, wherein the refresh timing supervisor is to reduce accesses to a memory bank if an associated one of said plurality of timers indicates a potential refresh shortage.

28. The system of claim 24 wherein said plurality of portion-specifying signals comprises a plurality of bank indicating signals.

29. The system of claim 24 further comprising a network interface.

* * * * *

UNITED STATES PATENT AND TRADEMARK OFFICE
CERTIFICATE OF CORRECTION

| | |
|---|---|
| PATENT NO. | : 7,617,356 B2 |
| APPLICATION NO. | : 10/334374 |
| DATED | : November 10, 2009 |
| INVENTOR(S) | : Kuljit S. Bains |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 446 days.

Signed and Sealed this

Nineteenth Day of October, 2010

David J. Kappos
*Director of the United States Patent and Trademark Office*